(12) United States Patent
Khlat

(10) Patent No.: US 8,588,713 B2
(45) Date of Patent: Nov. 19, 2013

(54) POWER MANAGEMENT SYSTEM FOR MULTI-CARRIERS TRANSMITTER

(75) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 69 days.

(21) Appl. No.: 13/343,840

(22) Filed: Jan. 5, 2012

(65) Prior Publication Data

US 2012/0176196 A1    Jul. 12, 2012

Related U.S. Application Data

(60) Provisional application No. 61/431,264, filed on Jan. 10, 2011.

(51) Int. Cl.
*H01Q 11/12* (2006.01)
*H04K 3/00* (2006.01)

(52) U.S. Cl.
USPC .......................................... 455/127.1; 330/297

(58) Field of Classification Search
USPC ................... 455/127.1–127.4; 330/297
See application file for complete search history.

(56) References Cited

U.S. PATENT DOCUMENTS

| | | |
|---|---|---|
| 4,996,500 A | 2/1991 | Larson et al. |
| 5,311,309 A | 5/1994 | Ersoz et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,581,454 A | 12/1996 | Collins |
| 5,646,621 A | 7/1997 | Cabler et al. |
| 5,715,526 A | 2/1998 | Weaver, Jr. et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html?cmp_ids=71&news_ids=222901746.

(Continued)

*Primary Examiner* — Lee Nguyen
(74) *Attorney, Agent, or Firm* — Withrow & Terranova, P.L.L.C.

(57) ABSTRACT

A power management system for a multi-carriers transmitter is disclosed. The power management system includes a first switcher having a control input and a power output, and a second switcher having a control input and a power output. Also included is a mode switch having a mode control input, wherein the mode switch is adapted to selectively couple the power output of the first switcher to the power output of the second switcher in response to a mode control signal received by the mode control input. Further included is a control system adapted to generate the mode control signal. The control system is coupled to the mode control input of the mode switch.

31 Claims, 8 Drawing Sheets

(56) References Cited

U.S. PATENT DOCUMENTS

| | | |
|---|---|---|
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,348,780 B1 | 2/2002 | Grant |
| 6,559,689 B1 | 5/2003 | Clark |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,728,163 B2 | 4/2004 | Gomm et al. |
| 6,819,938 B2 | 11/2004 | Sahota |
| 6,995,995 B2 | 2/2006 | Zeng et al. |
| 7,058,373 B2 | 6/2006 | Grigore |
| 7,164,893 B2 | 1/2007 | Leizerovich et al. |
| 7,233,130 B1 | 6/2007 | Kay |
| 7,411,316 B2 | 8/2008 | Pai |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,805,115 B1 | 9/2010 | McMorrow et al. |
| 7,859,336 B2 | 12/2010 | Markowski et al. |
| 7,907,010 B2 | 3/2011 | Wendt et al. |
| 7,994,864 B2 | 8/2011 | Chen et al. |
| 8,000,117 B2 | 8/2011 | Petricek |
| 8,008,970 B1 | 8/2011 | Homol et al. |
| 8,081,199 B2 | 12/2011 | Takata et al. |
| 8,093,951 B1 | 1/2012 | Zhang et al. |
| 8,164,388 B2 | 4/2012 | Iwamatsu |
| 8,174,313 B2 | 5/2012 | Vice |
| 8,198,941 B2 | 6/2012 | Lesso |
| 8,204,456 B2 | 6/2012 | Xu et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0122171 A1 | 6/2005 | Miki et al. |
| 2005/0156662 A1 | 7/2005 | Raghupathy et al. |
| 2005/0157778 A1 | 7/2005 | Trachewsky et al. |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0183532 A1 | 8/2007 | Matero |
| 2007/0259628 A1 | 11/2007 | Carmel et al. |
| 2008/0044041 A1 | 2/2008 | Tucker et al. |
| 2008/0081572 A1 | 4/2008 | Rofougaran |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0167260 A1 | 7/2009 | Pauritsch et al. |
| 2009/0174466 A1 | 7/2009 | Hsieh et al. |
| 2009/0190699 A1 | 7/2009 | Kazakevich et al. |
| 2009/0218995 A1 | 9/2009 | Ahn |
| 2009/0289720 A1 | 11/2009 | Takinami et al. |
| 2009/0319065 A1 | 12/2009 | Risbo |
| 2010/0017553 A1 | 1/2010 | Laurencin et al. |
| 2010/0171553 A1 | 7/2010 | Okubo et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2011/0018626 A1 | 1/2011 | Kojima |
| 2011/0084760 A1 | 4/2011 | Guo et al. |
| 2011/0148375 A1 | 6/2011 | Tsuji |
| 2011/0235827 A1 | 9/2011 | Lesso et al. |
| 2012/0034893 A1 | 2/2012 | Baxter et al. |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0170334 A1 | 7/2012 | Menegoli et al. |
| 2012/0176196 A1 | 7/2012 | Khlat |
| 2012/0236444 A1 | 9/2012 | Srivastava et al. |
| 2013/0034139 A1 | 2/2013 | Khlat et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006073208 A1 | 7/2006 |

OTHER PUBLICATIONS

Knutson, P., et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm$^2$ at 81% Efficiency," 2010 IEEE International Solid State Circuits Conference, Feb. 20-24, 2010, pp. 210-212.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira files 100th envelope tracking patent," CS: Compound Semiconductor, Apr. 11, 2011, 1 page.

Non-final Office Action for U.S Appl. No. 12/112,006 mailed Apr. 5, 2010, 6 pages.

Notice of Allowance for U.S. Appl. No. 12/112,006 mailed Jul. 19, 2010, 6 pages.

International Search Report for PCT/US11/033037 mailed Aug. 9, 2011, 10 pages.

(56) References Cited

OTHER PUBLICATIONS

International Search Report for PCT/US2011/044857 mailed Oct. 24, 2011, 10 pages.
International Search Report for PCT/US11/49243 mailed Dec. 22, 2011, 9 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.
International Search Report for PCT/US06/12619 mailed May 8, 2007, 2 pages.
International Search Report for PCT/US2011/061009 mailed Feb. 8, 2012, 14 pages.
Invitation to Pay Additional Fees and Where Applicable Protest Fee for PCT/US2011/061007 mailed Feb. 13, 2012, 7 pages.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
International Search Report for PCT/US2011/064255 mailed Apr. 3, 2012, 12 pages.
Extended European Search Report for application 06740532.4 mailed Dec. 7, 2010, 7 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
International Search Report for PCT/US2012/023495 mailed May 7, 2012, 13 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
International Search Report for US PCT/US2012/036858 mailed Aug. 9, 2012, 7 pages.
International Search Report for US PCT/US2012/036858 mailed Aug. 10, 2012, 8 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
International Preliminary Report on Patentability for PCT/US2011/064255, mailed Jun. 20, 2013, 7 pages.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Non-Final Office Action for U.S. Appl. No. 13/367,973, mailed Sep. 24, 2013, 8 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/602,856, mailed Sep. 24, 2013, 9 pages.
International Preliminary Report on Patentability for PCT/US2012/023495, mailed Aug. 15, 2013, 10 pages.
International Preliminary Report on Patentability for PCT/US2012/024124, mailed Aug. 22, 2013, 8 pages.

FIG. 1
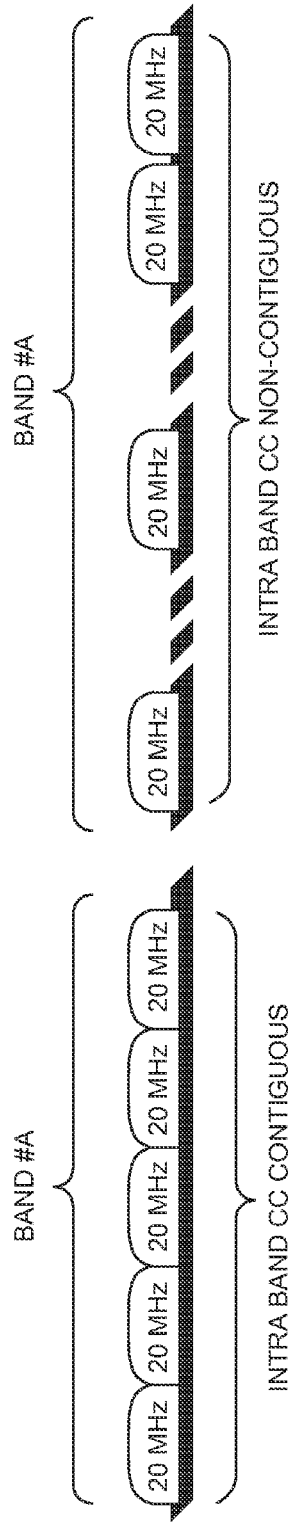
FIG. 2
FIG. 3
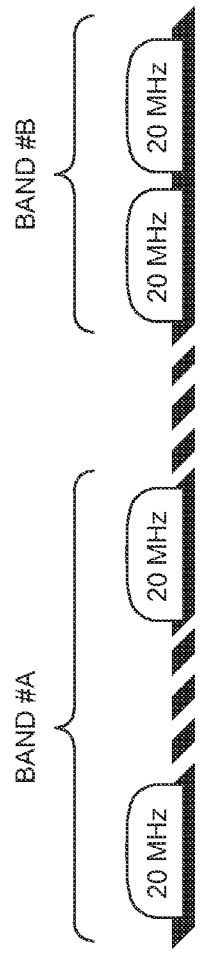
FIG. 4

POWER MANAGEMENT SYSTEM FOR MULTI-CARRIERS TRANSMITTER

RELATED APPLICATIONS

This application claims the benefit of U.S. provisional patent application Ser. No. 61/431,264, filed Jan. 10, 2011, the disclosure of which is incorporated herein by reference in its entirety.

FIELD OF THE DISCLOSURE

The present disclosure relates to a power management system for a communications system.

BACKGROUND

Future cellular equipment types such as handsets, notebook computers, and tablet computers will require simultaneous transmission of signals at two different frequencies, referred to as multi-carriers. These multi-carriers require a wide bandwidth for each carrier. Each of the multi-carriers typically require up to 20 MHz of bandwidth. Long term evolution (LTE-Advanced) as currently defined allows for the possibility of multi-carrier transmission in a single band or in different bands. As a result, LTE-Advanced customers will be afforded relatively large data rates.

FIG. 1 is a spectrum diagram that demonstrates a peak data rate increase via a bandwidth increase. In this case, five multi-carriers each having a 20 MHz bandwidth can yield up to 100 MHz of total bandwidth for a given user.

FIG. 2 is a spectrum diagram depicting intra band component carriers (CC) that are contiguous within a band A. For this case, the multi-carriers are aggregated in the spectrum allocated to band A. Therefore, a typical power management system having a modern fast power converter referred to herein as a switcher can be used to drive a single power amplifier (PA) for transmitting multi-carriers that are contiguous within the band A. However, bandwidth requirements for the typical power management system can be exceeded even while using intra band component carriers (CC) that are contiguous within a single band.

FIG. 3 is a spectrum diagram depicting intra band CC that are non-contiguous within the band A. In this case, the problem of increased bandwidth requirement for a power management system is made even worse since the spectrum is not used in a contiguous manner.

FIG. 4 is a spectrum diagram depicting inter band CC within the band A and within a band B. The bandwidth requirement for a power management system is even greater in this case since multi-carriers are spread among the band A and the band B.

FIG. 5 depicts a related art power management system 10 that drives a single power amplifier (PA) 12 for multi-carriers. The power management system 10 includes a full size switcher 14 that converts power from an energy source such as a battery (not shown) to power levels that are appropriate for the single PA 12.

An output filter 16 that is coupled to an output node 18 of the second switching power supply is continuously coupled between the full size switcher 14 and a power supply node 20 of the single PA 12. The output filter 16 is an LC type filter for reducing output ripple voltage that is a component of a dynamic voltage output from the full size switcher 14. The output filter 16 includes an inductor LLINEAR coupled between the output terminal 18 and the power supply node 20 of the single PA 12. A capacitor CLINEAR is coupled between the inductor LLINEAR and a fixed voltage node such as ground GND. Typically, the inductor LLINEAR has an inductance value of a few nH, while the CLINEAR capacitor has a capacitance value of a few nF. For example, the inductor LLINEAR has an inductance value that ranges from about 1 nH to 10 nH, and the first capacitor CLINEAR has a capacitance value that ranges from about 1 nF to 10 nF.

An operational amplifier (OPAMP) 22 drives the full size switcher in response to an analog control signal VRAMP coupled to a first OPAMP input 24. An output 26 of the OPAMP 22 is coupled to a control input 28 of the full size switcher 14. Alternating current AC components are passed from the output 26 of the OPAMP 22 through an output capacitor COUT that is coupled between the output 26 and the power supply node 20. A sample of a common collector voltage (VCC) pseudo envelope following (PEF) signal is coupled from the power supply node 20 to a second OPAMP input 30. An enable signal EN is usable to enable and disable the single PA 12.

FIG. 6 is a spectrum diagram that depicts a VCC bandwidth (BW) of the full size switcher 14 for dual carriers that provide modulation for the single PA 12. In particular, the modulation bandwidth of the full size switcher 14 is a function of an offset frequency Df between a carrier #1 and a carrier #2. Therefore, the higher the offset frequency Df between the carrier #1 and the carrier #2, the higher the modulation bandwidth must be. At some point, the offset frequency Df is large enough that related art approaches for modulating the VCC PEF via the full size switcher 14 are no longer practical. Moreover, even if the offset frequency Df is equal to zero between two adjacent carriers having a 20 MHz bandwidth each, a resulting 50 MHz VCC BW is too large for efficient modulation of the VCC PEF via the full size switcher 14.

What is needed is a power management system that meets the VCC BW requirements for a multi-carriers transmitter that uses envelope tracking or pseudo envelope following for intra band component carriers (CC) that are contiguous or non-contiguous within the band A and for inter band CC within the band A and within the band B. In particular, there is a need for a power management system that includes a switcher type power supply that extends the use of envelope tracking or pseudo envelope following for a modulation bandwidth greater than 20 MHz such as 2×20 MHz required for high data rate applications like those allowed with LTE-Advanced.

SUMMARY OF THE DISCLOSURE

The present disclosure provides a power management system for a multi-carriers transmitter that includes a switcher type power supply that extends the use of envelope tracking or pseudo envelope following for a modulation bandwidth greater than 20 MHz such as 2×20 MHz required for high data rate applications like those allowed with LTE-Advanced. In particular, the power management system includes a first switcher having a control input and a power output, and a second switcher having a control input and a power output. Also included is a mode switch having a mode control input, wherein the mode switch is adapted to selectively couple the power output of the first switcher to the power output of the second switcher in response to a mode control signal received by the mode control input. Further included is a control system adapted to generate the mode control signal. The control system is coupled to the mode control input of the mode switch.

In one embodiment, the power management system further includes an analog multiplexer having a control input coupled to the control system, a first analog input, a second analog input, a first analog output, and a second analog output. Also further included is a first operational amplifier (OPAMP) having a first input for receiving a first analog control signal, a second input communicatively coupled to the power output of the first switcher, and an output coupled to the first analog input to provide feedback to the control input of the first switcher and/or to provide feedback to the control input of the second switcher through the analog multiplexer in response to the mode control signal generated by the control system. The feedback provided by the first OPAMP corresponds to an output voltage provided at the power output of the first switcher.

Also further included is a second OPAMP having a first input for receiving a second analog control signal, a second input communicatively coupled to the power output of the second switcher, and an output coupled to the second analog input to provide feedback to the control input of the first switcher and/or to provide feedback to the control input of the second switcher through the analog multiplexer in response to the mode control signal generated by the control system. The feedback provided by the second OPAMP corresponds to an output voltage provided at the power output of the second switcher.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 1 is a spectrum diagram that demonstrates a peak data rate increase via a bandwidth increase.

FIG. 2 is a spectrum diagram depicting intra band component carriers (CC) that are contiguous within a band A.

FIG. 3 is a spectrum diagram depicting intra band CC that are non-contiguous within the band A.

FIG. 4 is a spectrum diagram depicting inter band CC within the band A and within a band B.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 5:
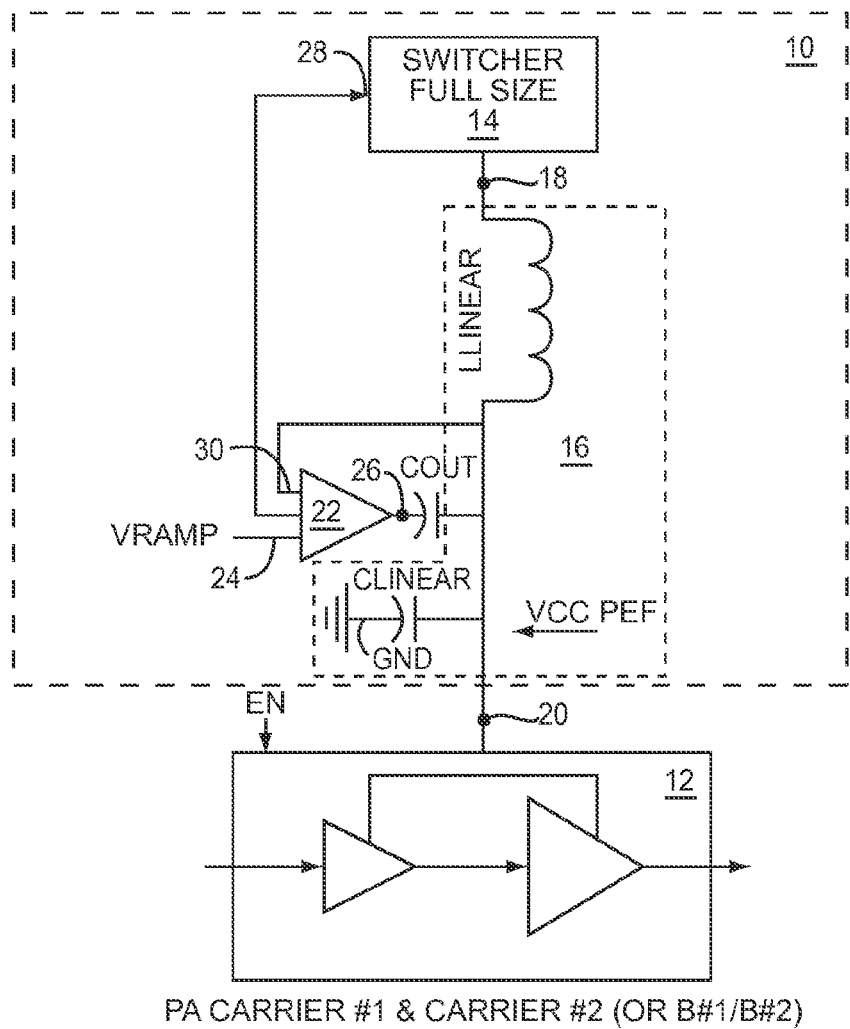
FIG. 5 is a schematic diagram of a related art single power amplifier (PA) power management system for multi-carriers.
Figure 6:
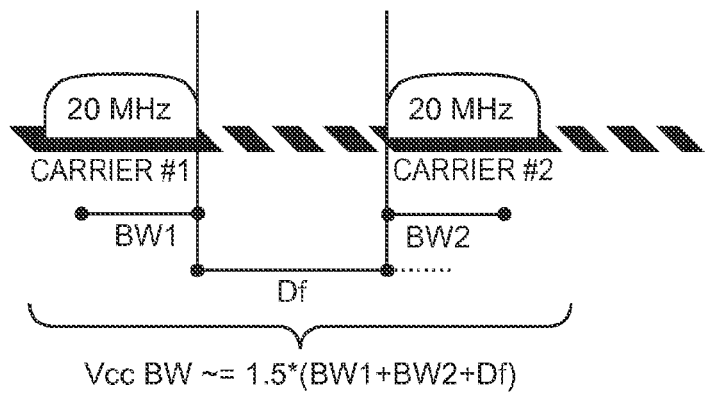
FIG. 6 is a spectrum diagram for a common collector (Vcc) bandwidth (BW) for a power supply of the related art single transmitter PA power management system for multi-carriers shown in FIG. 5.
Figure 7:
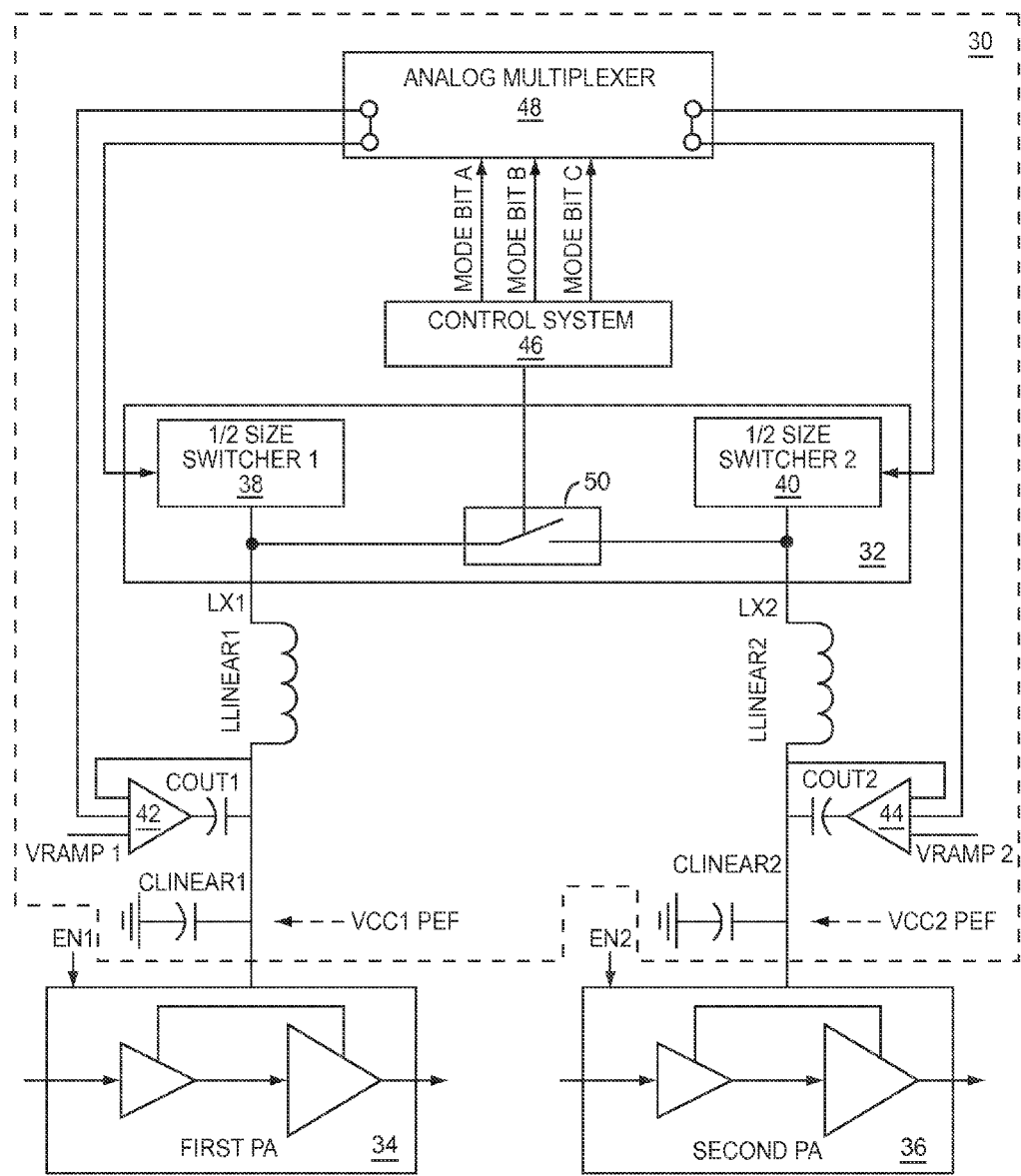
FIG. 7 is a schematic diagram of a dual transmitter PA power management system for multi-carriers that in accordance with the present disclosure is shown operating in a first mode.

FIG. 7 depicts a multi-band power management system 30 for multi-carriers that is in accordance with the present disclosure. The multi-band power management system 30 includes a full size power converter 32 that converts power from an energy source such as a battery (not shown) to power levels that are appropriate for a first PA 34 and a second PA 36. The full size power converter 32 includes a first ½ size switcher 38 and a second ½ size switcher 40. The first ½ size switcher 38 and the second ½ size switcher 40 can each be a buck, buck/boost, or a buck/boost with charge pump type switcher. Moreover, the first ½ size switcher 38 is coupled to an output filter made up of a first inductor LLINEAR1 and a first capacitor CLINEAR 1. Similarly, the second ½ size switcher 40 is coupled to an output filter made up of a second inductor LLINEAR2 and a second capacitor CLINEAR2.

A first OPAMP 42 and a second OPAMP 44 control the first ½ size switcher 38 and the second ½ size switcher 40. A control system 46 drives an analog multiplexer 48 with three mode bits A, B, and C to control the modes of the multi-band power management system 30 and a mode switch 50. Preferably, the mode switch 50 is a field effect transistor (FET) with a gate, source and drain. Other switches such as micro-electromechanical mechanical systems (MEMS) switches may also be used for the mode switch 50. Table 1 below lists the modes of the multi-band power management system 30.

TABLE 1

| MODE | MODE BIT A | MODE BIT B | MODE BIT C | PA 1 | PA2 |
|---|---|---|---|---|---|
| 0 | 0 | 0 | 0 | ON, ½ POWER | ON, ½ POWER |
| 1 | 0 | 0 | 1 | ON, FULL PWR | OFF |
| 2 | 0 | 1 | 0 | ON, ½ POWER | OFF |
| 3 | 0 | 1 | 1 | OFF | ON FULL PWR |
| 4 | 1 | 0 | 0 | OFF | ON, ½ POWER |

As shown in FIG. 7 and according to Table 1, in a first mode (MODE 0), the first PA 34 and second PA 36 are both enabled via an enable signal EN1 and an enable signal EN2. Mode 0 is useful for supplying power such that dual carriers can be transmitted simultaneously using the first PA 34 to amplify a first carrier and the second PA 36 to amplify a second carrier. The control system 46 commands the analog multiplexer 48 via the control bits A, B, and C to route feedback from the first OPAMP 42 to the first ½ size switcher 38, and to route feedback from the second OPAMP 44 to the second ½ size switcher 40. The control system also commands the mode switch 50 open. As a result, the first PA 34 is supplied with half power (−3 dB) by the first ½ size switcher 38 and the second PA 36 is supplied with half power by the second ½ size switcher 40.

Figure 8:
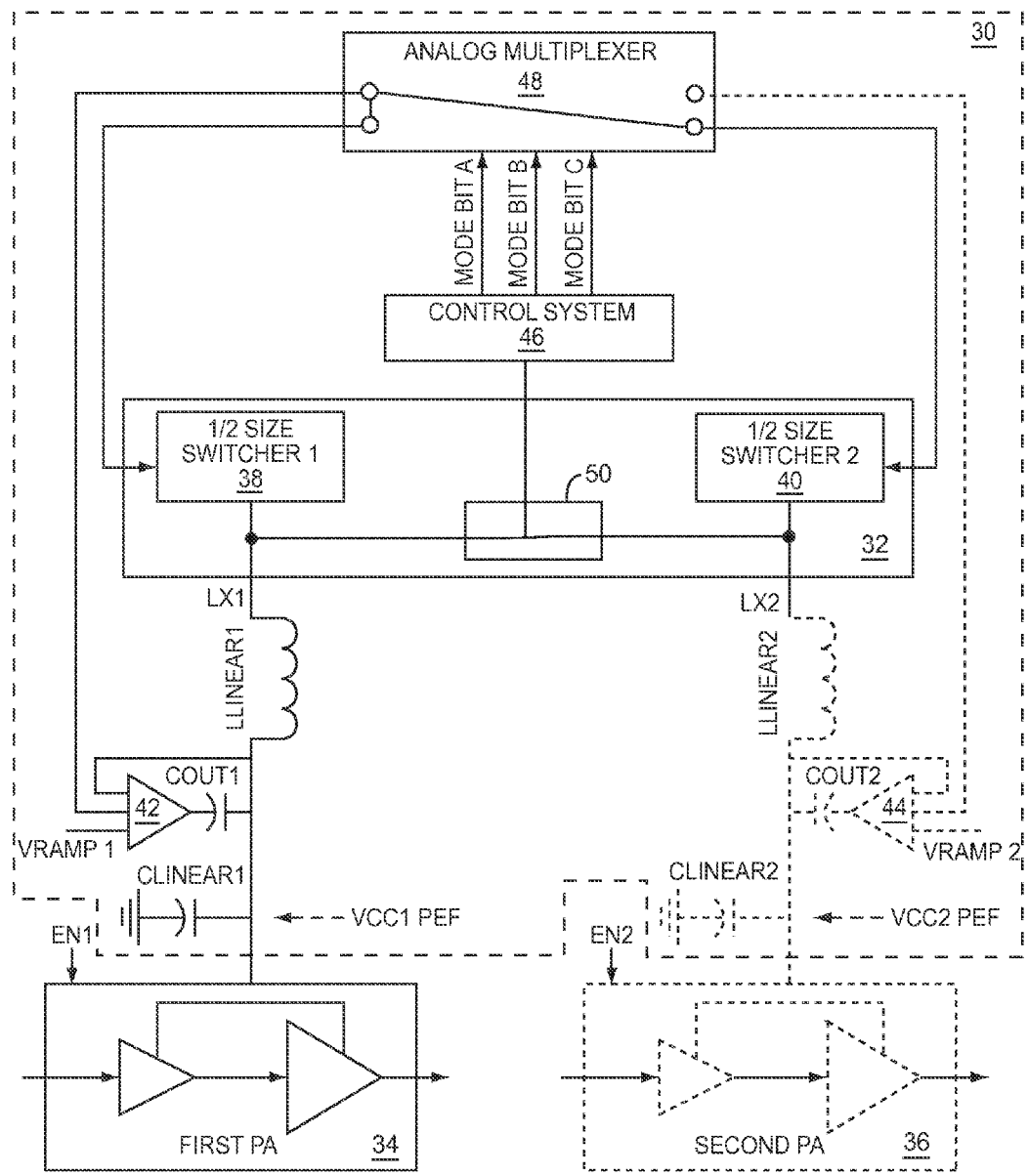
FIG. 8 is a schematic diagram of the dual transmitter PA power management system for multi-carriers that in accordance with the present disclosure is shown operating in a second mode.

As shown in FIG. 8 and according to Table 1, in a second mode (MODE 1), the second PA 36 is not enabled and is off as indicated by dashed lines. As a result, MODE 1 is a single carrier transmission mode. The second PA 36 is disabled via the enable signal EN2. The second OPAMP 44 is also temporarily disabled so that it does not draw power. However, the first ½ size switcher 38 and the second ½ size switcher 40 are both on. The control system 46 commands the analog multiplexer 48 to route feedback from the first OPAMP 42 to both the first ½ size switcher 38 and the second ½ size switcher 40. The control system 46 also commands the mode switch 50 closed. As a result, the first PA 34 is supplied with full power while the second PA 36 is off. During MODE 1, the efficiency of the multi-band power management system 30 is slightly negatively impacted due to thermal losses that occur in the mode switch 50. However, it is possible to provide an extra switcher state during the modulation envelope of the VCC PEF in which the mode switch 50 is opened for a relatively short period of time. As a result, a required modulated current is allowed to flow briefly from the first ½ size switcher 38 only. In this way, any reduction in efficiency caused by the mode switch 50 is minimized. However, an engineering tradeoff pertaining to an efficiency cost of charging the gate and the drain and source of the mode switch 50 during each closure of the mode switch 50 should be considered.

Figure 9:
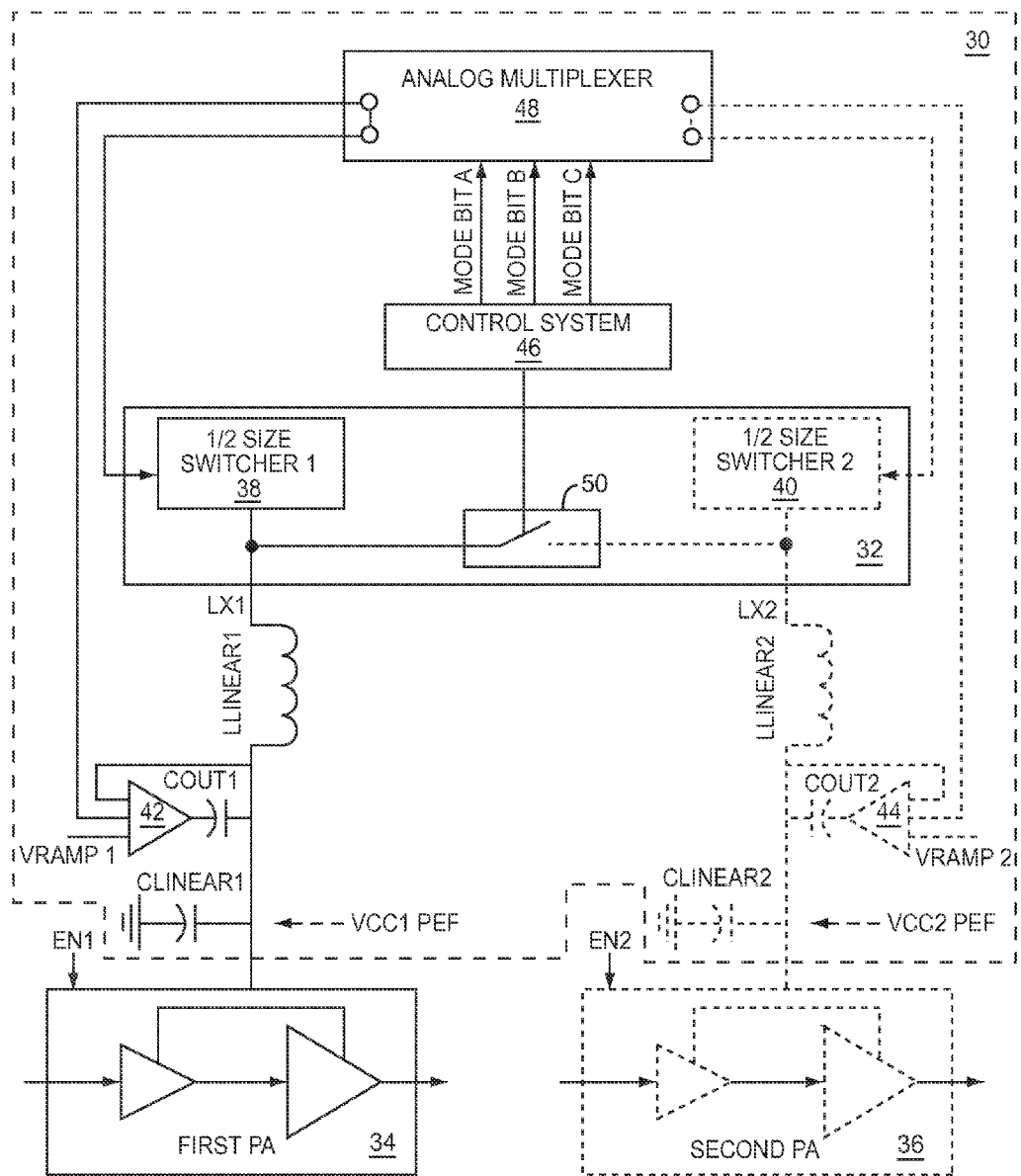
FIG. 9 is a schematic diagram of the dual transmitter PA power management system for multi-carriers that in accordance with the present disclosure is shown operating in a third mode.

As shown in FIG. 9 and according to Table 1, in a third mode (MODE 2), the second PA 36 and the second OPAMP 44 remain off. Moreover, in MODE 2, the second ½ size switcher 40 is off. The control system 46 commands the analog multiplexer 48 to route feedback only from the first OPAMP 42 to the first ½ size switcher 38. The control system 46 also commands the mode switch 50 open. As a result, the first PA 34 is supplied with half power while the second PA 36 is off. In a practical sense, the MODE 2 is a quasi improved segmentation mode since the second ½ size switcher 40 is off and does not load a first output node LX1 with relatively large off parasitic capacitances. This is due to a second output node LX2 having an off parasitic capacitance that is in series with the off parasitic capacitance of the mode switch 50.

Figure 10:
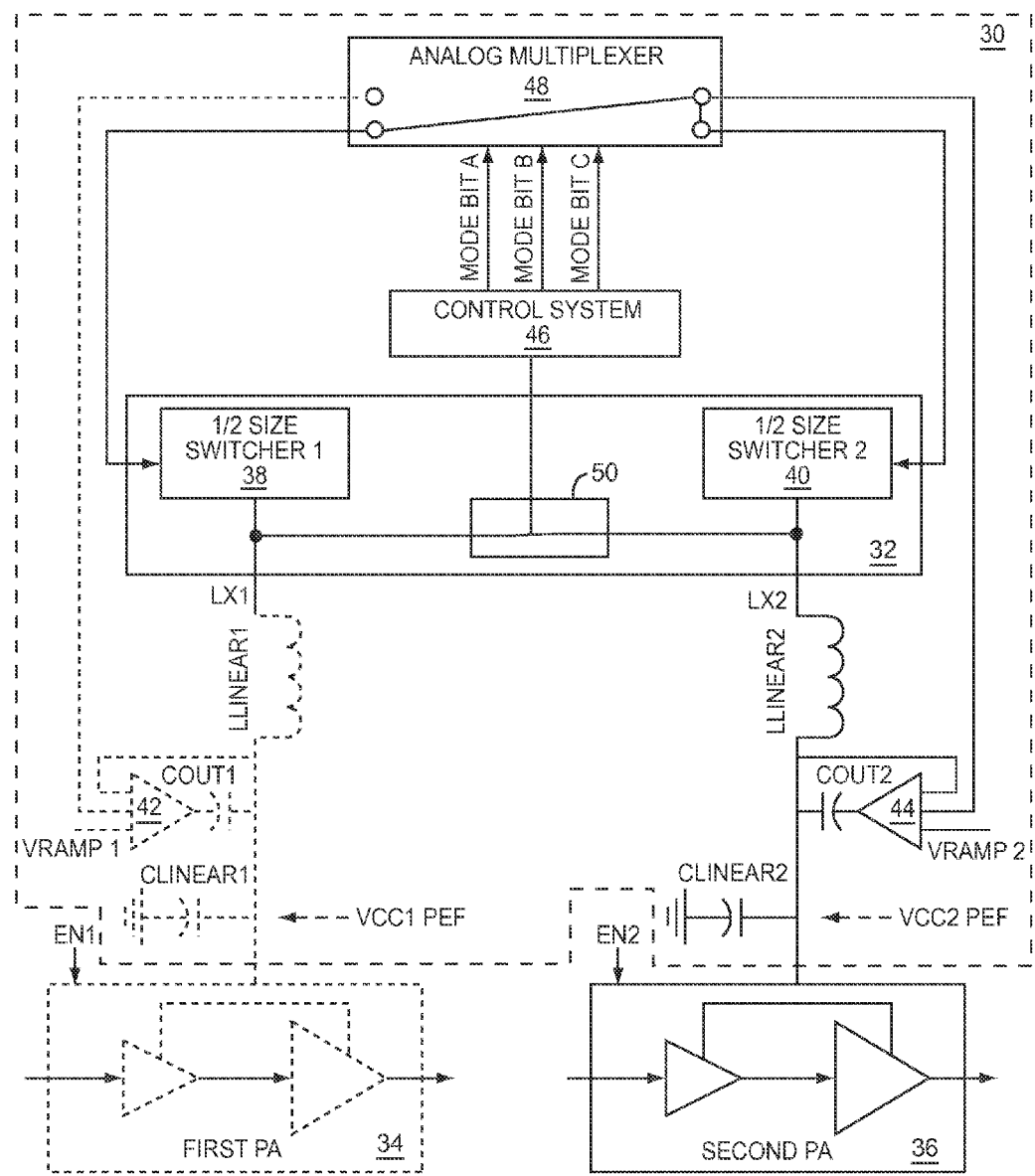
FIG. 10 is a schematic diagram of the dual transmitter PA power management system for multi-carriers that in accordance with the present disclosure is shown operating in a fourth mode.

As shown in FIG. 10 and according to Table 1, in a fourth mode (MODE 3), the first PA 34 is not enabled and is off. The first OPAMP 42 is also disabled so that it does not draw power. However, both the first ½ size switcher 38 and the second ½ size switcher 40 are both on, and the control system 46 commands the analog multiplexer 48 to route feedback from the second OPAMP 44 to both the first ½ size switcher 38 and the second ½ size switcher 40. The control system 46 also commands the mode switch 50 closed. As a result, the second PA 36 is supplied with full power while the first PA 34 is off.

Figure 11:
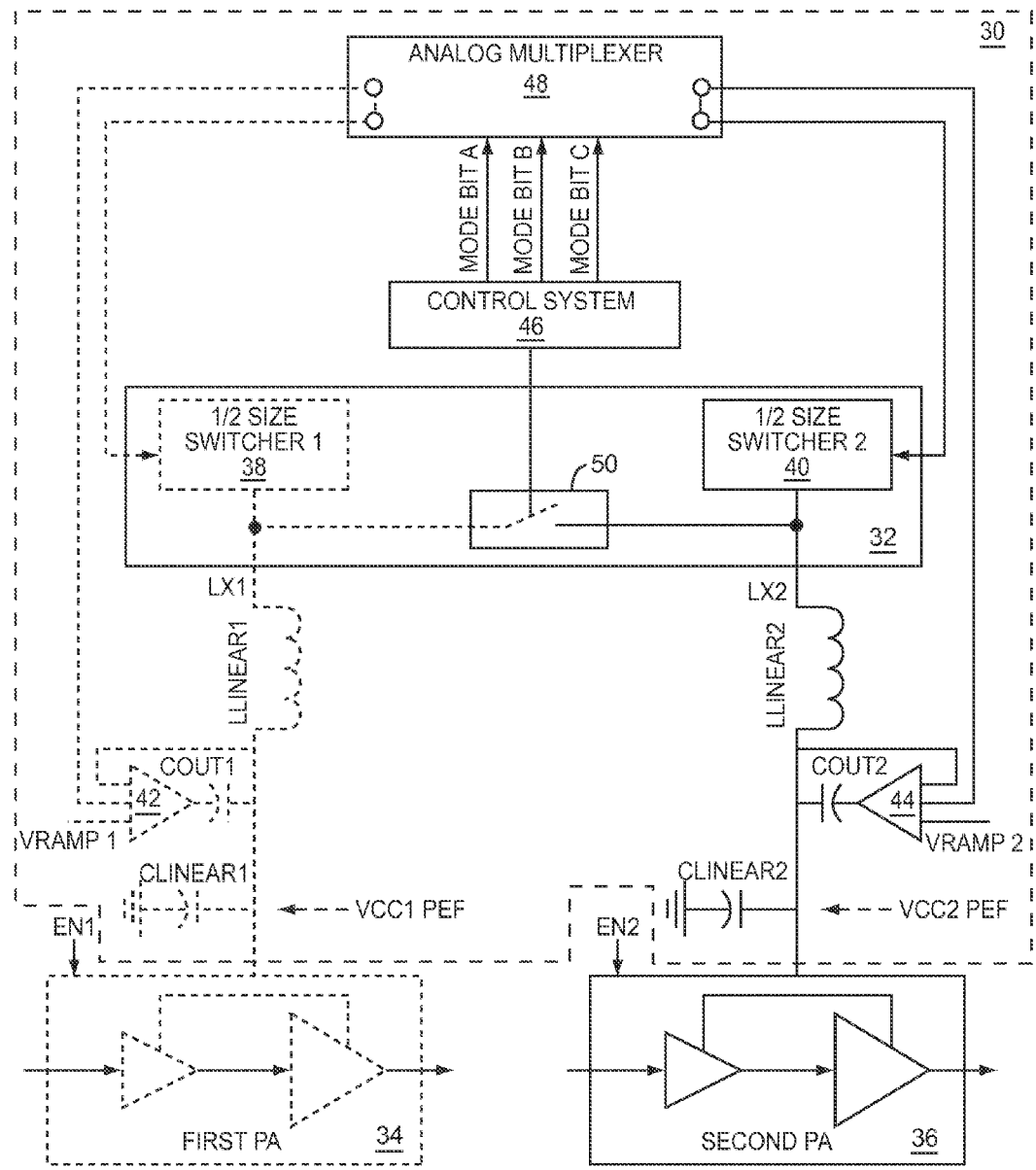
FIG. 11 is a schematic diagram of the dual transmitter PA power management system for multi-carriers that in accordance with the present disclosure is shown operating in a fifth mode.

As shown in FIG. 11 and according to Table 1, in a fifth mode (MODE 4), the first PA 34 and the first OPAMP 42 remain off. Moreover, in MODE 4, the first ½ size switcher 38 is off and the control system 46 commands the analog multiplexer 48 to route feedback from the second OPAMP 44 to the second ½ size switcher 40 only. The control system 46 also commands the mode switch 50 open. As a result, the second PA 36 is supplied with half power while the first PA 34 is off.

Figure 12:
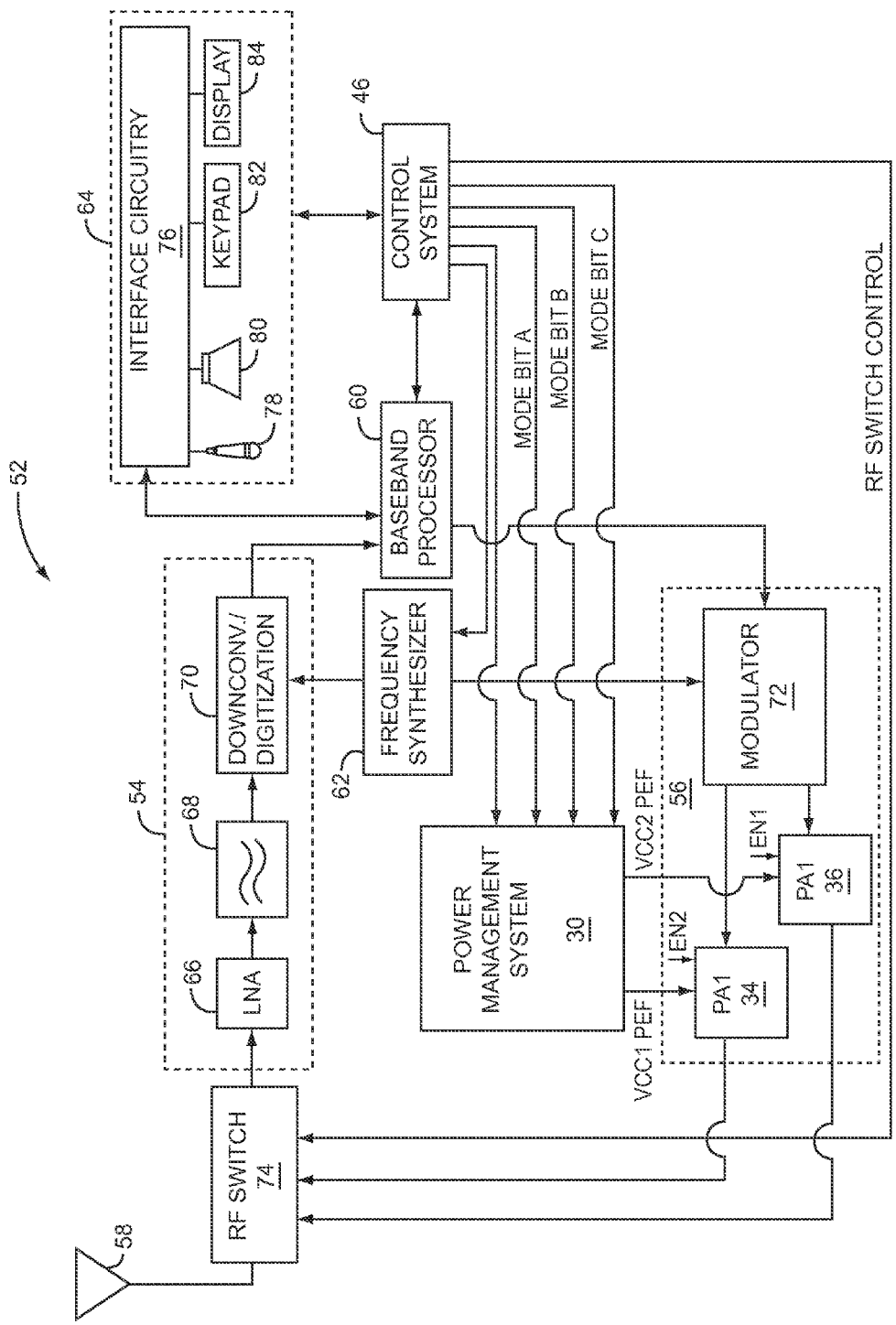
FIG. 12 is a block diagram of a mobile terminal that incorporates the dual transmitter PA power management system for multi-carriers of the present disclosure.

Turning now to FIG. 12, the multi-band power management system 30 is incorporated in a mobile terminal 52, such as a cellular handset, a personal digital assistant (PDA), or the like. The basic architecture of the mobile terminal 52 may include a receiver front end 54, an RF transmitter section 56, an antenna 58, a baseband processor 60, the control system 46, a frequency synthesizer 62, and an interface 64. The receiver front end 54 receives information bearing RF signals from one or more remote transmitters provided by a base station. A low noise amplifier (LNA) 66 amplifies the signal. A filter circuit 68 minimizes broadband interference in the received signal, while downconversion and digitization circuitry 70 downconverts the filtered, received signal to an intermediate or baseband frequency signal, which is then digitized into one or more digital streams. The receiver front end 54 typically uses one or more mixing frequencies generated by the frequency synthesizer 62.

The baseband processor 60 processes the digitized received signal to extract the information or data bits conveyed in the received signal. This processing typically comprises demodulation, decoding, and error correction operations. As such, the baseband processor 60 is generally implemented in one or more digital signal processors (DSPs).

On the transmit side, the baseband processor 60 receives digitized data, which may represent voice, data, or control information from the control system 46 which it encodes for transmission. The encoded data is output to the RF transmitter section 56, where it is used by a modulator 72 to modulate a carrier signal that is at a desired transmit frequency. The first PA 34 and the second PA 36 amplify multi-band modulated carrier signals to levels that are appropriate for transmission from the antenna 58. An RF switch 74 responsive to an RF SWITCH CONTROL signal generated by the control system 46 selectively transfers transmit signals to and from the antenna 58.

A user may interact with the mobile terminal 52 via the interface 64, which may include interface circuitry 76 associated with a microphone 78, a speaker 80, a keypad 82, and a display 84. The interface circuitry 76 typically includes analog-to-digital converters, digital-to-analog converters, amplifiers, and the like. Additionally, it may include a voice encoder/decoder, in which case it may communicate directly with the baseband processor 60.

The microphone 78 will typically convert audio input, such as the user's voice, into an electrical signal, which is then digitized and passed directly or indirectly to the baseband processor 60. Audio information encoded in the received signal is recovered by the baseband processor 60 and converted into an analog signal suitable for driving the speaker 80 by the interface circuitry 76. The keypad 82 and the display 84 enable the user to interact with the mobile terminal 52 by inputting numbers to be dialed, address book information, or the like, as well as monitoring call progress information.

Those skilled in the art will recognize improvements and modifications to the embodiments of the present disclosure. All such improvements and modifications are considered within the scope of the concepts disclosed herein and the claims that follow.

What is claimed is:

1. A power management system for a multi-carriers transmitter comprising:
   a first switcher having a control input and a power output;
   a second switcher having a control input and a power output;
   a mode switch having a mode control input, wherein the mode switch is adapted to selectively couple the power output of the first switcher to the power output of the second switcher in response to a mode control signal received by the mode control input; and
   a control system coupled to the mode control input of the mode switch, wherein the control system is adapted to generate the mode control signal.

2. The power management system of claim 1 wherein a first mode, a first power amplifier (PA) is enabled to receive power output from the first switcher and a second PA is enabled to receive power output from the second switcher in which the mode switch is commanded open by the control system.

3. The power management system of claim 1 wherein a second mode, a first PA is enabled to receive power output from both the first switcher and the second switcher as a second PA is disabled while the mode switch is commanded closed by the control system.

4. The power management system of claim 1 wherein a third mode, a first PA is enabled to receive power from the first switcher while a second PA is disabled and the mode switch is commanded open by the control system.

5. The power management system of claim 1 wherein a fourth mode, a first PA is disabled and a second PA is enabled to receive power from both the first switcher and the second switcher and the mode switch is commanded closed by the control system.

6. The power management system of claim 1 wherein a fifth mode, a first PA is disabled and a second PA is enabled to receive power from the second switcher only and the mode switch is commanded open by the control system.

7. The power management system of claim 1 further comprising:
    an analog multiplexer having a control input coupled to the control system, a first analog input, a second analog input, a first analog output, and a second analog output;
    a first operational amplifier (OPAMP) having a first input for receiving a first analog control signal, a second input communicatively coupled to the power output of the first switcher, and an output coupled to the first analog input to provide feedback to the control input of the first switcher and/or to provide feedback to the control input of the second switcher through the analog multiplexer in response to the mode control signal generated by the control system, the feedback corresponding to an output voltage provided at the power output of the first switcher; and
    a second OPAMP having a first input for receiving a second analog control signal, a second input communicatively coupled to the power output of the second switcher, and an output coupled to the second analog input to provide feedback to the control input of the first switcher and/or to provide feedback to the control input of the second switcher through the analog multiplexer in response to the mode control signal generated by the control system, the feedback corresponding to an output voltage provided at the power output of the second switcher.

8. The power management system of claim 7 wherein a first mode, a first PA is enabled to receive power output from the first switcher and a second PA is enabled to receive power output from the second switcher in which the mode switch is commanded open by the control system and the analog multiplexer is commanded to route feedback from the first OPAMP to the first switcher while also being commanded to route feedback from the second OPAMP to the second switcher.

9. The power management system of claim 7 wherein a second mode, a first PA is enabled to receive power output from both the first switcher and the second switcher as a second PA is disabled while the mode switch is commanded closed by the control system and the analog multiplexer is commanded by the control system to route feedback from the first OPAMP to both the first switcher and the second switcher.

10. The power management system of claim 7 wherein a third mode, a first PA is enabled to receive power from the first switcher while a second PA is disabled and the mode switch is commanded open by the control system and the analog multiplexer is commanded to route the feedback from the first OPAMP to the first switcher.

11. The power management system of claim 10 wherein the second switcher is off.

12. The power management system of claim 7 wherein a fourth mode, a first PA is disabled and a second PA is enabled to receive power from both the first switcher and the second switcher and the mode switch is commanded closed by the control system and the analog multiplexer is commanded by the control system to route the feedback from the second OPAMP to the second switcher.

13. The power management system of claim 7 wherein a fifth mode, a first PA is disabled and a second PA is enabled to receive power from the second switcher only and the mode switch is commanded open by the control system and the analog multiplexer is commanded by the control system to route feedback from the second OPAMP to the second switcher.

14. The power management system of claim 13 wherein the first switcher is off.

15. A method for operating a power management system for a multi-carriers transmitter, the power management system including a first switcher and a second switcher, and a mode switch adapted to selectively couple and decouple a power output of the first switcher to a power output of the second switcher via a mode control signal, comprising:
    generating a mode control signal for a dual transmitter mode that opens the mode control switch so that power output from the first switcher powers a first PA and power output from the second switcher powers a second PA; and
    generating a mode control signal for a single transmitter mode that closes the mode control switch so that power output from the first switcher and power output from the second switcher powers only an enabled one of the first PA or the second PA.

16. The method of claim 15 further including in the dual transmitter mode driving the first switcher with a feedback of output power from the first switcher and driving the second switcher with a feedback of output power from the second switcher.

17. The method of claim 15 further including in the single transmitter mode driving the first switcher and the second switcher with a feedback of a combined output power of the first switcher and the second switcher.

18. A mobile terminal comprising:
    a first PA for amplifying a first transmitter signal;
    a second PA for amplifying a second transmitter signal;
    a power management system for a multi-carriers transmitter comprising:
        a first switcher having a control input and a power output for powering the first PA and/or second PA;
        a second switcher having a control input and a power output for powering the first PA and/or second PA;
        a mode switch having a mode control input, wherein the mode switch is adapted to selectively couple the power output of the first switcher to the power output of the second switcher in response to a mode control signal received by the mode control input; and
        a control system coupled to the mode control input of the mode switch, wherein the control system is adapted to generate the mode control signal.

19. The mobile terminal of claim 18 wherein a first mode, a PA is enabled to receive power output from the first switcher and a second PA is enabled to receive power output from the second switcher in which the mode switch is commanded open by the control system.

20. The mobile terminal of claim 18 wherein a second mode, a first PA is enabled to receive power output from both the first switcher and the second switcher as a second PA is disabled while the mode switch is commanded closed by the control system.

21. The mobile terminal of claim 18 wherein a third mode, a first PA is enabled to receive power from the first switcher while a second PA is disabled and the mode switch is commanded open by the control system.

22. The mobile terminal of claim 18 wherein a fourth mode, a first PA is disabled and a second PA is enabled to receive power from both the first switcher and the second switcher and the mode switch is commanded closed by the control system.

23. The mobile terminal of claim 18 wherein a fifth mode, a first PA is disabled and a second PA is enabled to receive power from the second switcher only and the mode switch is commanded open by the control system.

24. The mobile terminal of claim 18 further comprising:
an analog multiplexer having a control input coupled to the control system, a first analog input, a second analog input, a first analog output, and a second analog output;
a first operational amplifier (OPAMP) having a first input for receiving a first analog control signal, a second input communicatively coupled to the power output of the first switcher, and an output coupled to the first analog input to provide feedback to the control input of the first switcher and/or to provide feedback to the control input of the second switcher through the analog multiplexer in response to the mode control signal generated by the control system, the feedback corresponding to an output voltage provided at the power output of the first switcher; and
a second OPAMP having a first input for receiving a second analog control signal, a second input communicatively coupled to the power output of the second switcher, and an output coupled to the second analog input to provide feedback to the control input of the first switcher and/or to provide feedback to the control input of the second switcher through the analog multiplexer in response to the mode control signal generated by the control system, the feedback corresponding to an output voltage provided at the power output of the second switcher.

25. The mobile terminal of claim 24 wherein a first mode, the first PA is enabled to receive power output from the first switcher and the second PA is enabled to receive power output from the second switcher in which the mode switch is commanded open by the control system and the analog multiplexer is commanded to route feedback from the first OPAMP to the first switcher while also being commanded to route feedback from the second OPAMP to the second switcher.

26. The mobile terminal of claim 24 wherein a second mode, a first PA is enabled to receive power output from both the first switcher and the second switcher as the second PA is disabled while the mode switch is commanded closed by the control system and the analog multiplexer is commanded by the control system to route feedback from the first OPAMP to both the first switcher and the second switcher.

27. The mobile terminal of claim 24 wherein a third mode, a first PA is enabled to receive power from the first switcher while a second PA is disabled and the mode switch is commanded open by the control system and the analog multiplexer is commanded to route the feedback from the first OPAMP to the first switcher.

28. The mobile terminal of claim 27 wherein the second switcher is off.

29. The mobile terminal of claim 24 wherein a fourth mode, the first PA is disabled and the second PA is enabled to receive power from both the first switcher and the second switcher and the mode switch is commanded closed by the control system and the analog multiplexer is commanded by the control system to route the feedback from the second OPAMP to the second switcher.

30. The mobile terminal of claim 24 wherein a fifth mode, the first PA is disabled and the second PA is enabled to receive power from the second switcher only and the mode switch is commanded open by the control system and the analog multiplexer is commanded by the control system to route feedback from the second OPAMP to the second switcher.

31. The mobile terminal of claim 30 wherein the first switcher is off.

* * * * *